United States Patent [19]
Takahashi et al.

[11] Patent Number: 4,564,825
[45] Date of Patent: Jan. 14, 1986

[54] PIEZOELECTRIC FILTER

[75] Inventors: Hiroyuki Takahashi, Takaoka; Takashi Yamamoto, Ishikawa, both of Japan

[73] Assignee: Murata Manufacturing Co., Ltd., Japan

[21] Appl. No.: 634,128

[22] Filed: Jul. 25, 1984

[30] Foreign Application Priority Data

Aug. 15, 1983 [JP] Japan .................. 58-148968

[51] Int. Cl.⁴ .................. H03H 9/56; H03H 9/58
[52] U.S. Cl. .................. 333/191; 310/333; 310/366; 333/189; 333/192
[58] Field of Search ............... 333/186-192, 333/200; 310/321, 325, 331-333, 365-367, 370

[56] References Cited
U.S. PATENT DOCUMENTS 3,321,648  5/1967  Kolm ........................ 333/187 X
3,590,287  6/1971  Berlincourt et al. ........ 310/321
3,763,446 10/1973  Toyoshima et al. ......... 333/191 X Primary Examiner—Marvin L. Nussbaum
Attorney, Agent, or Firm—Ostrolenk, Faber, Gerb & Soffen

[57] ABSTRACT

A piezoelectric filter of the energy-trapped type which utilizes thickness shear mode is disclosed, wherein first and second resonator units are connected in a cascade manner. Each of the resonator units includes a piezoelectric plate which has a slit formed therein and a pair of front electrodes on the front thereof and a pair of back electrodes on the back thereof, with the slit lying between each pair of the electrodes. The pair of back electrodes of the second resonator unit are electrically connected to each other. The first and second resonator units are positioned so that the back electrodes of one of the two units face against those of the other, and then mechanically coupled together through the use of an electrically nonconductive adhesive. The back electrodes of the first and second resonator units are led commonly outwardly, while the pair of the front electrodes of the first resonator unit form an input electrode and an output electrode.

6 Claims, 7 Drawing Figures

FIG. 1 PRIOR ART
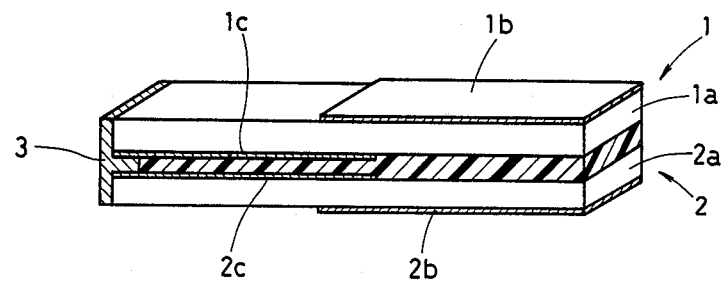
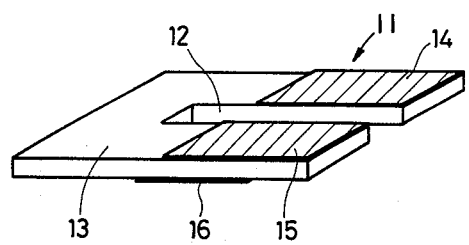
FIG. 2A
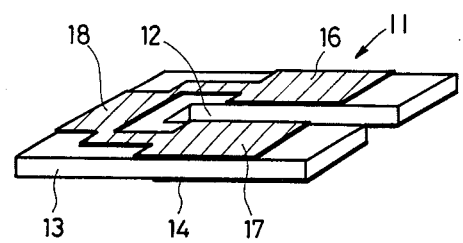
FIG. 2B
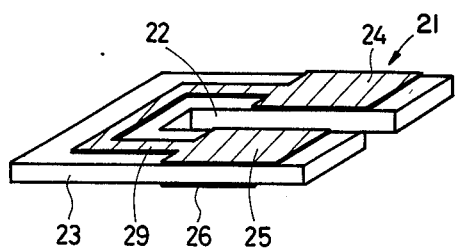
FIG. 3A
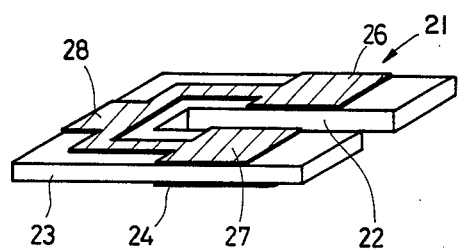
FIG. 3B

PIEZOELECTRIC FILTER

BACKGROUND OF THE INVENTION

1. Field of the Invention

This invention relates to an improvement in a piezoelectric filter of the structure wherein a pair of piezoelectric plates are adhered together.

2. Description of the Prior Art

In FIG. 1, there is illustrated a perspective view of a conventional piezoelectric filter which is the background of the invention. The piezoelectric filter as shown in FIG. 1 comprises a first energy-trapped type thickness shear mode resonator unit 1 and a second energy-trapped type thickness shear mode resonator unit 2 both of which are spaced a predetermined distance from each other and mechanically coupled in part with each other. Each of the first and second resonator units 1 and 2 has piezoelectric plates 1a, 2a and electrodes 1b, 1c, 2b, 2c disposed on the front and back of the respective plates. In the given example, the respective back electrodes 1c and 2c are led commonly outwardly and electrically connected to a layer 3 of electrically conductive adhesive, while the respective front electrodes 1b and 2b constitute an input electrode and an output electrode. It can be said that this piezoelectric filter is a double mode filter wherein there occur two resonances being different from each other in resonance frequency, namely, so-called a symmetric mode resonance and antisymmetric mode resonance; the former is the one wherein the input electrode and output electrode vibrate in phase, while the latter is the one wherein the input electrode and output electrode vibrate in antiphase.

Since only a few types of resonators are available as economically satisfactory ones in a 1 MHz zone, a plurality of the piezoelectric filters as shown in FIG. 1 are often used in the form of a cascade connection. It is, therefore, preferable that the resonance frequency of the respective piezoelectric plates 1a and 2a be identical in the piezoelectric filter of the structure as shown in FIG. 1. However, if it is desired to use two piezoelectric filters of FIG. 1 in a cascade connection, four piezoelectric plates are required. A further requirement is that the resonance frequency of the four piezoelectric plates be equal and uniform. It is, however, practically impossible to make uniform the resonance frequency of as many as four piezoelectric plates, especially because the respective piezoelectric plates of the piezoelectric filter of the above mentioned type are cut out of different mother plates. This leads to a sizable deviation in filter performance.

SUMMARY OF THE INVENTION

Therefore, the object of the invention is provision of a cascade-connected piezoelectric filter wherein deviation in filter performance is reduced to a minimum.

Briefly speaking, the present invention provides a piezoelectric filter of the energy-trapped type utilizing thickness shear vibration mode, comprising first and second resonator units each having a piezoelectric plate with a slit formed therein, a pair of front electrodes disposed on the front surface of the piezoelectric plate with the intervention of the slit and a pair of back electrodes disposed at the back of the piezoelectric plate so as to partially overlap with the pair of the front electrodes, wherein the pair of the front electrodes of the second resonator unit are electrically connected through a joint, and the first and second resonator units are positioned and spaced a predetermined distance so that the respective pairs of the back electrode face against each other, and mechanically coupled at least in part, and wherein the back electrodes of the first and second resonator units are led commonly outwardly while the pair of the front electrodes of the first resonator unit constitute an input electrode and an output electrode. It can be said that this piezoelectric filter is a double mode filter wherein there occur two resonances being different from each other in resonance frequency, namely, so-called a symmetric mode resonance and antisymmetric mode resonance; the former in the one wherein the input electrode and output electrode vibrate in phase, while the latter is the one wherein the input electrode and output electrode vibrate in antiphase.

In a specific aspect of the present invention, there is provided a ground electrode disposed on the back surface of the piezoelectric plate of each of the first and second resonator units and extending to the edge of one side of the plate electric plate opposite the slit side. The pair of the back electrodes on each of the respective piezoelectric plates are electrically connected to the ground electrode. Furthermore, the ground electrodes are electrically connected together with an electrically conductive adhesive injected between the first and second resonator units.

Should the respective pairs of the back electrodes of the first and second resonator units be disposed to extend to one edge of the piezoelectric plates, it becomes possible to lead the respective back electrodes commonly outwardly at that edge portion without provision of the ground electrodes.

Mechanical coupling of the first and second resonator units can be accomplished by injecting a suitable adhesive between the resonator units, for example.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view of a conventional piezoelectric filter which is the background technique of the present invention;

FIGS. 2A and 2B show perspective views of a first resonator unit for use with an embodiment of the present invention, wherein FIG. 2A is a perspective view while viewed from front and FIG. 2B one viewed from back;

FIGS. 3A and 3B show perspective views of a second resonator unit wherein FIG. 3A is a front perspective view and FIG. 3B a back perspective view;

Figure 4:
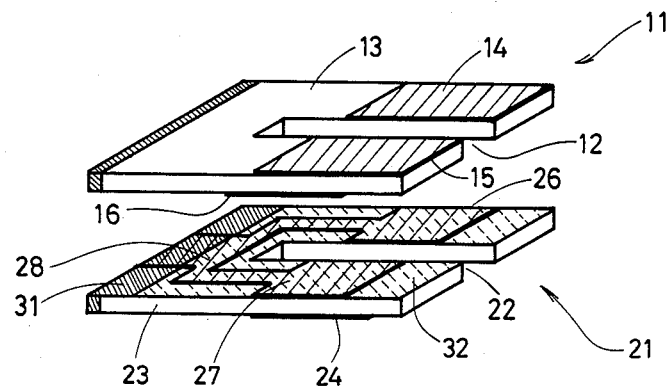
FIG. 4 is a perspective view for explaining the process of making the illustrated embodiment of the present invention.

Other features and advantages of the present invention will be more clearly understood upon reading the following description of specific embodiments with reference to the drawings.

DESCRIPTION OF THE PREFERRED EMBODIMENTS

In FIGS. 2A and 2B, there are illustrated perspective views of a first resonator unit for use with an embodiment of the present invention, while being viewed from the front and back thereof, respectively. The first resonator unit 11 includes a piezoelectric plate 13 with a slit 12 formed therein as its major component. It is clear from FIG. 2A that there are disposed on the front surface of the piezoelectric plate 13 a pair of front electrodes 14 and 15, with the slit 12 lying therebetween. On the other hand, as is clear from FIG. 2B, there are disposed on the back surface of the piezoelectric plate 13 a pair of back electrodes 16 and 17 which sandwich the slit 12 therebetween and overlap at least partially with the front electrodes 15 and 14, respectively. In the illustrated embodiment, the back electrodes 16 and 17 are connected to a ground electrode 18 and led commonly outwardly of the unit.

FIGS. 3A and 3B are a front perspective view and a back perspective view of a second resonator unit for use with the embodiment of the present invention. The second resonator unit 21 includes a piezoelectric plate 23 having a slit 22 formed therein as its major component. Disposed on the front surface of the piezoelectric plate 23 are a pair of front electrodes 24 and 25 with intervention of the slit 22 therebetween. These front electrodes 24 and 25 are different from those 14 and 15 of the first resonator unit 11 of FIG. 1 in that the former 24 and 25 are electrically connected by a joint 29 as obvious from FIG. 3A. Likewise the back electrodes 16 and 17 of the first resonator a pair of back electrodes 26 and 27 are disposed on the back surface of the piezoelectric plate 23 as best illustrated in FIG. 3B.

The resulting first and second resonator units 11 and 12, as shown in FIG. 4, are laminated in such a manner that one pair of the back electrodes 16 and 17 face against the other pair of the back electrode 27 and 26, respectively. The reference number 31 in FIG. 4 represents a layer of electrically conductive adhesive for connecting the ground electrodes 18 and 28 each connected to the respective back electrodes 16, 17 and 27, 26. It is noted that the second resonator unit 21 is coated on its back surface with an electrically nonconductive adhesive 32 except on the region where the electrically conductive adhesive layer 31 is present. Although not particularly shown in the drawings, the back surface of the first resonator unit 11 is treated in a similar manner. Provided that the first and second resonator units 11 and 21 thus treated are adhesively coupled together, a piezoelectric filter as shown in a perspective view of FIG. 5 is completed.

Figure 5:
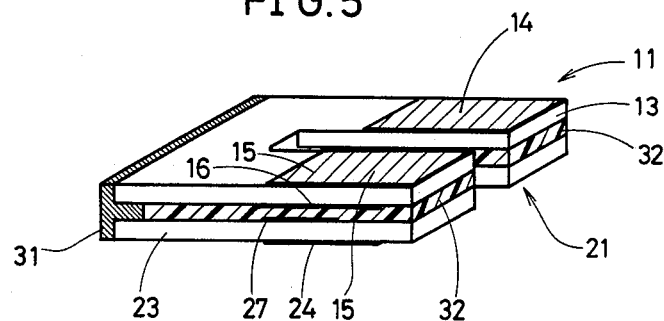
FIG. 5 is a perspective view of the embodiment of the present invention made through the process of FIG. 4.

In the piezoelectric filter of FIG. 5, one of the pair of the front electrodes 14 and 15 of the first resonator unit 11 constitutes an input electrode and the other an output electrode. If the front electrode 14 is used as the input electrode, then the piezoelectric filter operates in the following manner. Applying a voltage between the front electrode 14 of the first resonator unit and the back electrode 17 causes vibration at the region of the piezoelectric plate 13 of the first resonator unit 11 where the front electrode 14 faces the back electrode 17. This vibration is conveyed to the region of the piezoelectric plate 23 of the second resonator unit 21 where the back electrode 26 is disposed, because the first and second resonator units 11 and 21 are mechanically coupled together through the use of the electrically nonconductive adhesive 32. The vibration thus conveyed permits an electric charge to generate on the front electrode 25 which faces against the back electrode 26 of the second resonator unit 21. This electric charge runs through the joint 29 and reaches the other front electrode 24. It follows that a voltage is applied between the front electrode 24 and the back electrode 27 facing against the front electrode 24 to cause another vibration. This vibration is conveyed through the electrically nonconductive adhesive 32 to the region of the piezoelectric plate 13 of the first resonator unit 11 where the back electrode 16 is disposed. The result is vibration at the region of the piezoelectric plate 13 where the back electrode 16 is disposed, which vibration is picked up through the front electrode 15. The piezoelectric filter in the embodiment of FIG. 5 is equivalent to a cascade connection of two piezoelectric filters each having two piezoelectric plates adhered together. Furthermore, it is obvious from the structure of FIG. 5 that no more than two piezoelectric plates 13 and 23 are used as piezoelectric plates. Because the piezoelectric filter can be manufactured from only two mother boards, it becomes very easy to unify the resonance frequency with the same number of manufacturing steps as in the case of the conventional piezoelectric filter of FIG. 1 (the single piezoelectric filter before cascade connection).

Although in the above illustrate embodiment the respective back electrodes 16, 17 and 26, 27 of the first and second resonator units 11 and 21 are shaped to be connected commonly to the ground electrodes 18 and 28, it is obvious that the respective back electrodes may be disposed to extent to an edge portion where the electrically conductive adhesive 31 is disposed. In addition, the respective front electrodes 14, 15, 24, 25 and the back electrodes 16, 17, 26, 27 are required to "overlap at least partially with each other." That is, it is not necessarily required that those electrodes overlap wholly with each other. Similarly, since it is necessary that the first and second resonator units 11 and 21 be mechanically coupled "at least partially" together, the electrically nonconductive adhesive layer 32 may be injected completely as in the embodiment of FIG. 5 or partially.

It is further to be pointed out that the shapes of the slits formed in the piezoelectric plates and the respective electrodes should not be limited to those illustrated in the drawings.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A piezoelectric filter of the energy-trapped type utilizing thickness shear vibration mode, comprising:
(A) first and second resonator units, each resonator unit including:
  (1) a piezoelectric plate having a slit formed therein;
  (2) a pair of front electrodes disposed on a front surface of the piezoelectric plate with the slit being located between the front electrodes; and
  (3) a pair of back electrodes disposed at the back surface of the piezoelectric plate so as to at least partially overlap the pair of front electrodes; the pair of the front electrodes of the second resonator unit being electrically connected;

(B) means for positioning and spacing the first and second resonator units relative to one another so that the back electrodes of the first resonator unit face the back electrodes of the second resonator unit and such that the resonator units are at least partially mechanically coupled to one another;

(C) a terminal disposed on at least one of the piezoelectric plates, the terminal being electrically connected to the back electrodes of the first and second resonator units; and (D) the pair of front electrodes of the first resonator unit defining an input electrode and an output electrode, respectively.

2. A piezoelectric filter as set forth in claim 1 wherein each said resonator unit further comprises a ground electrode disposed on the back surface of the resonator unit to extend to an edge portion of one side of the piezoelectric plate opposite the side where the slit is formed, the pair of back electrodes being electrically connected to the ground electrode.

3. A piezoelectric filter as set forth in claim 2 wherein the respective resonator units face each other and the respective ground electrodes of the first and second resonator units are electrically connected to each other through an electrically conductive adhesive which is sandwiched by the resonator units and extend to an edge portion of the respective resonator units opposite the side where the slits are formed.

4. A piezoelectric filter as set forth in any one of claims 1 through 3 wherein said positioning means comprises an electrically nonconductive adhesive sandwiched between the first and second resonator units.

5. A piezoelectric filter as set forth in claim 1 wherein the respective pairs of the back electrodes disposed on the back surfaces of the respective piezoelectric plates of the first and second resonator units are disposed to extend to an edge portion of the piezoelectric plates opposite the side thereof where the slits are formed, and electrically connected together at the edge portions.

6. A piezoelectric filter as set forth in claim 5 wherein said positioning means comprises an adhesive which is sandwiched by the first and second resonator units, thus mechanically coupling the first and second resonator units together.

* * * * *